(12) United States Patent
Toda et al.

(10) Patent No.: US 7,704,019 B2
(45) Date of Patent: Apr. 27, 2010

(54) LEVITATION TRANSPORTATION DEVICE AND LEVITATION TRANSPORTATION METHOD

(75) Inventors: Masayuki Toda, Yonezawa (JP); Masaru Umeda, Tokyo (JP)

(73) Assignees: Kabushiki Kaisha Watanabe Shoko, Tokyo (JP); Toda, Masayuki, Yonezawa-Shi (JP)

( * ) Notice: Subject to any disclaimer, the term of this patent is extended or adjusted under 35 U.S.C. 154(b) by 259 days.

(21) Appl. No.: 11/630,437

(22) PCT Filed: Jun. 22, 2005

(86) PCT No.: PCT/JP2005/011416
§ 371 (c)(1), (2), (4) Date: Mar. 26, 2007

(87) PCT Pub. No.: WO2006/001294
PCT Pub. Date: Jan. 5, 2006

(65) Prior Publication Data
US 2008/0031696 A1    Feb. 7, 2008

(30) Foreign Application Priority Data
Jun. 28, 2004  (JP)  .................. 2004-189444

(51) Int. Cl.
*B65G 53/00* (2006.01)
(52) U.S. Cl. ............... 406/88; 406/12; 406/87
(58) Field of Classification Search .......... 406/87, 406/88, 194, 86, 12, 19, 83, 1–3, 8, 10; 414/676
See application file for complete search history.

(56) References Cited

U.S. PATENT DOCUMENTS

| | | | | |
|---|---|---|---|---|
| 3,279,863 A | * | 10/1966 | Zuppiger et al. | 406/19 |
| 3,614,168 A | * | 10/1971 | Range | 406/2 |
| 3,948,564 A | * | 4/1976 | Flint | 406/31 |
| 3,976,330 A | * | 8/1976 | Babinski et al. | 406/84 |
| 4,021,078 A | * | 5/1977 | Hutar et al. | 406/194 |
| 4,081,201 A | * | 3/1978 | Hassan et al. | 406/88 |

(Continued)

FOREIGN PATENT DOCUMENTS

EP    0 557 523 A1    9/1993

(Continued)

OTHER PUBLICATIONS

Microfilm of the specification and drawings annexed to the request of Japanese Utility Model Application No. 120493/1989 (Laid-open No. 59926/1991) (Murata Machinery Ltd.), Jun. 12, 1991, Full Text; Figs. 1 to 6 (Family: none).

*Primary Examiner*—Gene Crawford
*Assistant Examiner*—William R Harp
(74) *Attorney, Agent, or Firm*—Young & Thompson

(57) ABSTRACT

A levitation transportation device capable of adjustment when an object being transported is displaced from the center of a transportation path, A levitation transportation device having a transportation path forming a transportation router for an object to be transported, a plurality of jetting nozzles for transporting the object in a levitated manner along the transportation path, one or more detection sections for detecting the direction of the transportation of the object being transported in the transportation path and a control section for independently controlling the plurality of jetting nozzles based on a detection result by the detection sections.

19 Claims, 7 Drawing Sheets

U.S. PATENT DOCUMENTS

| | | | |
|---|---|---|---|
| 4,165,132 A | * | 8/1979 | Hassan et al. .................. 406/10 |
| 4,618,292 A | * | 10/1986 | Judge et al. .................... 406/19 |
| 4,874,273 A | * | 10/1989 | Tokisue et al. ................. 406/88 |
| 5,518,360 A | | 5/1996 | Toda et al. |
| 5,634,636 A | * | 6/1997 | Jackson et al. ............... 271/225 |
| 5,921,744 A | * | 7/1999 | Toda et al. ................... 414/755 |
| 7,165,918 B2 | * | 1/2007 | Kruse .......................... 406/93 |

FOREIGN PATENT DOCUMENTS

| | | |
|---|---|---|
| JP | 5-211225 | 8/1993 |
| JP | 9-156755 | 6/1997 |
| WO | WO 92/09103 | 5/1992 |

* cited by examiner

LEVITATION TRANSPORTATION DEVICE AND LEVITATION TRANSPORTATION METHOD

TECHNICAL FIELD

The present invention relates to a levitation transportation device for transporting a plate-state object to be transported by jetting a pressure gas to the object being transported in a levitated manner and a levitation transportation method using this levitation transportation device.

BACKGROUND ART

Patent Document 1: Japanese Patent Laid-Open No. 2000-72250

A levitation transportation device has been known that an object being transported such as a semiconductor wafer in a molding/machining process is transported while being levitated by jetting airflow (See Patent Document 1, for example).

This type of levitation transportation device performs transportation while carrying out a molding/machining process at a predetermined molding/machining stage by combining a transfer unit and a control unit.

FIG. 6 shows a state where the semiconductor wafer as an object to be transported is being transported in a part of such transportation process, and a large number of jetting nozzles with jetting ports opened on the surface are arranged laterally and vertically on a back face of a transportation path 1 extending in a predetermined direction. Also, a guard 3 rises on the sides of the transportation path 1 in order to prevent removal of a semiconductor wafer 2 from the transportation path 1 when the semiconductor wafer 2 being transported is displaced from the center of the transportation path 1.

FIG. 7 shows an example of a jetting nozzle for levitating/transporting such semiconductor wafers. In FIG. 7, a jetting nozzle 4 is a columnar body held by a holding hole 5a of a holding plate 5 forming the transportation path 1, and a projecting portion 4a is formed at a part thereof for positioning not being capable of relative rotation by engaging a recess portion 5b formed in the holding hole 5a. Also, the jetting nozzle 4 is provided with a communication path 4b opened on the back face of the holding plate 5 and a nozzle 4c penetrating from the upper end of this communication path 4b to the upper end face in the inclined state.

By this, a pressure gas supplied to the back face of the holding plate 5 is jetted from the nozzle 4c through the communication path 4b.

The inclination angle of the nozzle 4c, including a right angle, is determined by a transportation direction and the like of the semiconductor wafer 2.

DISCLOSURE OF INVENTION

PROBLEM TO BE SOLVED BY THE INVENTION

In the above constructed levitation transportation device, there is a problem that, since the jetting nozzle 4 is held at the holding plate 5, not being capable of relative rotation, when the semiconductor wafer 2 is displaced from the center of transportation in the middle of the transportation, it can not be corrected.

This displacement of the semiconductor wafer 2 from the center of transportation is caused by a jetting direction or pressure of the pressure gas jetted from the jetting nozzle 4 or by flatness on the back face of the semiconductor wafer 2.

In order to solve the above problem, the present invention has an object to provide a levitation transportation device capable of adjustment when an object being transported is displaced from the center of a transportation path and a levitation transportation method.

MEANS FOR SOLVING PROBLEM

In order to achieve the object, a levitation transportation device described in a first embodiment comprises a transportation path forming a transportation route for an object to be transported, a plurality of jetting nozzles for transporting the object in a levitated manner along the transportation path, one or more detection sections for detecting the direction of the transportation of the object being transported in the transportation path, and a control section for independently controlling the plurality of jetting nozzles based on a detection result of the detection section.

The levitation transportation device described in a second embodiment is characterized in that the control section controls a jetting direction or jetting pressure of a pressure gas jetted from the jetting nozzle based on the detection result of the detection section.

The levitation transportation device described in a third embodiment is characterized in that the control section drive-controls a driving motor for rotating the jetting nozzle in the same plane based on the detection result of the detection section.

The levitation transportation device described in a fourth embodiment is characterized in that the control section controls a jetting direction or jetting pressure of the pressure gas jetted from the jetting nozzle so that the object being transported is returned to the center of the transportation path based on the detection result of the detection section.

The levitation transportation device described in a fifth embodiment is characterized in that the control section controls a jetting direction or jetting pressure of the pressure gas jetted from the jetting nozzle so that the object being transported is not displaced from the center of the transportation path based on the detection result of the detection section.

The levitation transportation device described in a sixth embodiment is characterized in that the control section controls a jetting direction or jetting pressure of the pressure gas jetted from the jetting nozzle when a detection result that the object being transported is displaced from the center of the transportation path continuously in the same direction is obtained from the detection section.

The levitation transportation device described in a seventh embodiment is a line sensor having a detection range crossing the transporting direction of the transportation path and across the entire width of the transportation path.

A levitation transportation method described in an eighth embodiment is characterized in that the object to be transported is transported using the levitation transportation device described in any one of the first through seventh embodiments.

EFFECT OF THE INVENTION

According to the levitation transportation device of the present invention, adjustment can be made when the object being transported is displaced from the center of the transportation path.

EXPLANATIONS OF LETTERS OR NUMERALS

Figure 1:
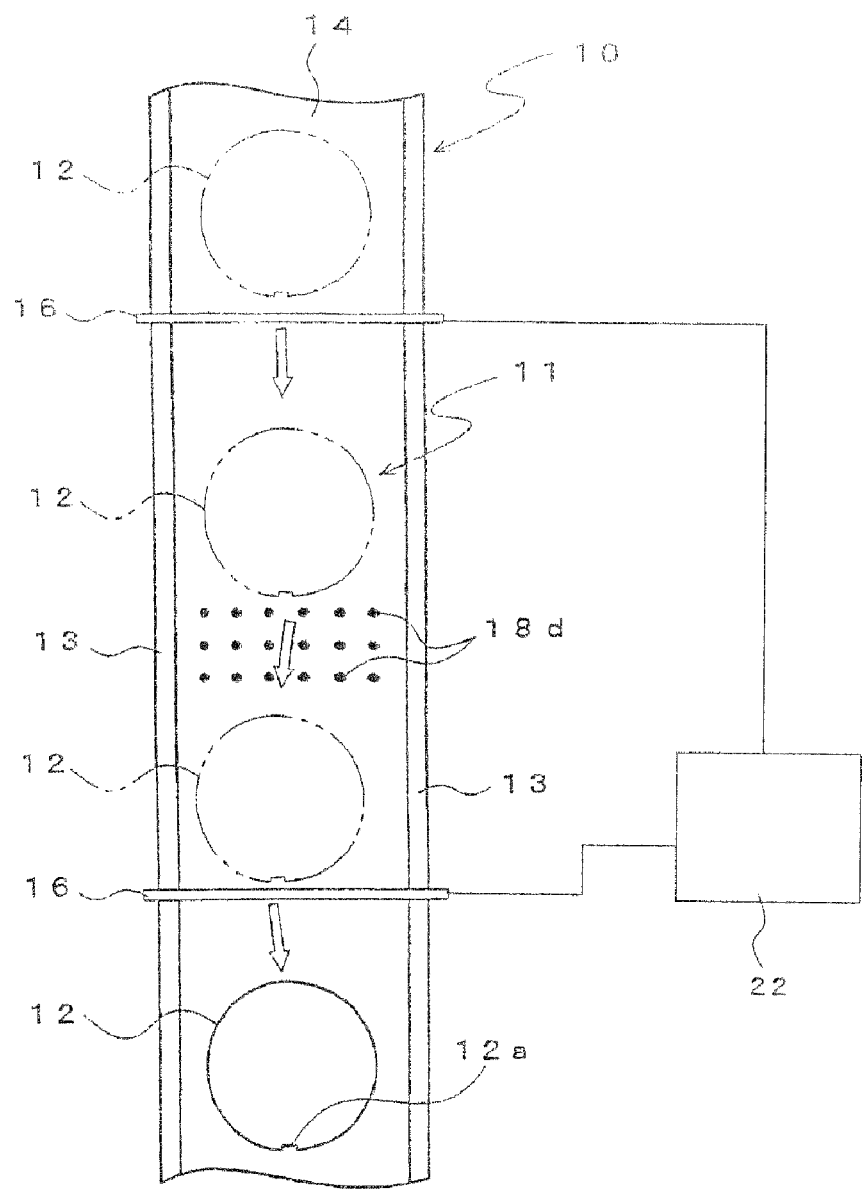
FIG. 1 is a plan view of an essential part of a levitation transportation device of the present invention.

10: Levitation transportation device
11: Transportation path
15: Jetting nozzle
20: Transportation section
21: Base section
18: Nozzle body

BEST MODES FOR CARRYING OUT THE INVENTION

Next, a levitation transportation device and a levitation transportation method of the present invention will be described based on the attached drawings.

Figure 2:
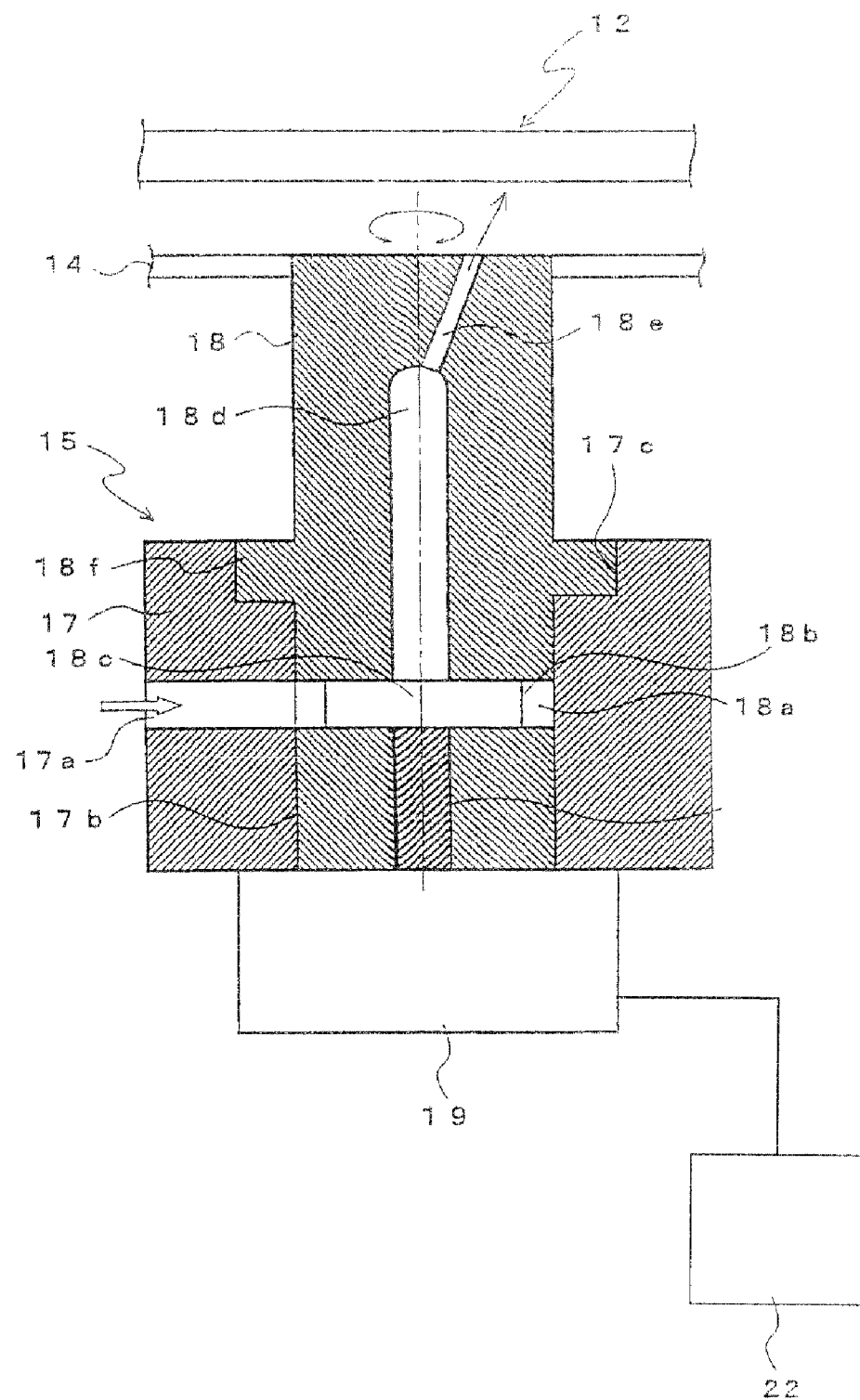
FIG. 2 is a sectional view of a jetting nozzle of the levitation transportation device of the present invention.
Figure 5:
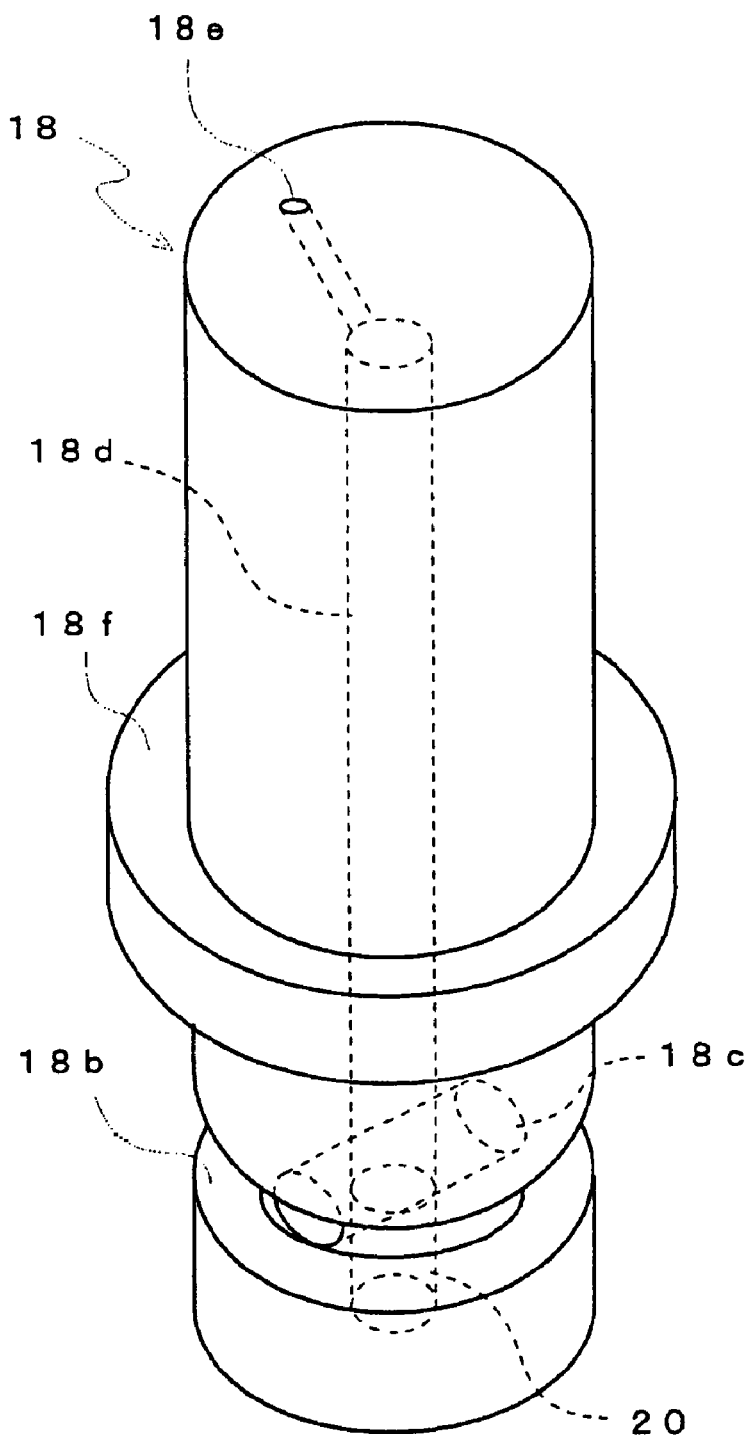
FIG. 5 is a perspective view of a nozzle body of the levitation transportation device of the present invention.
Figure 6:
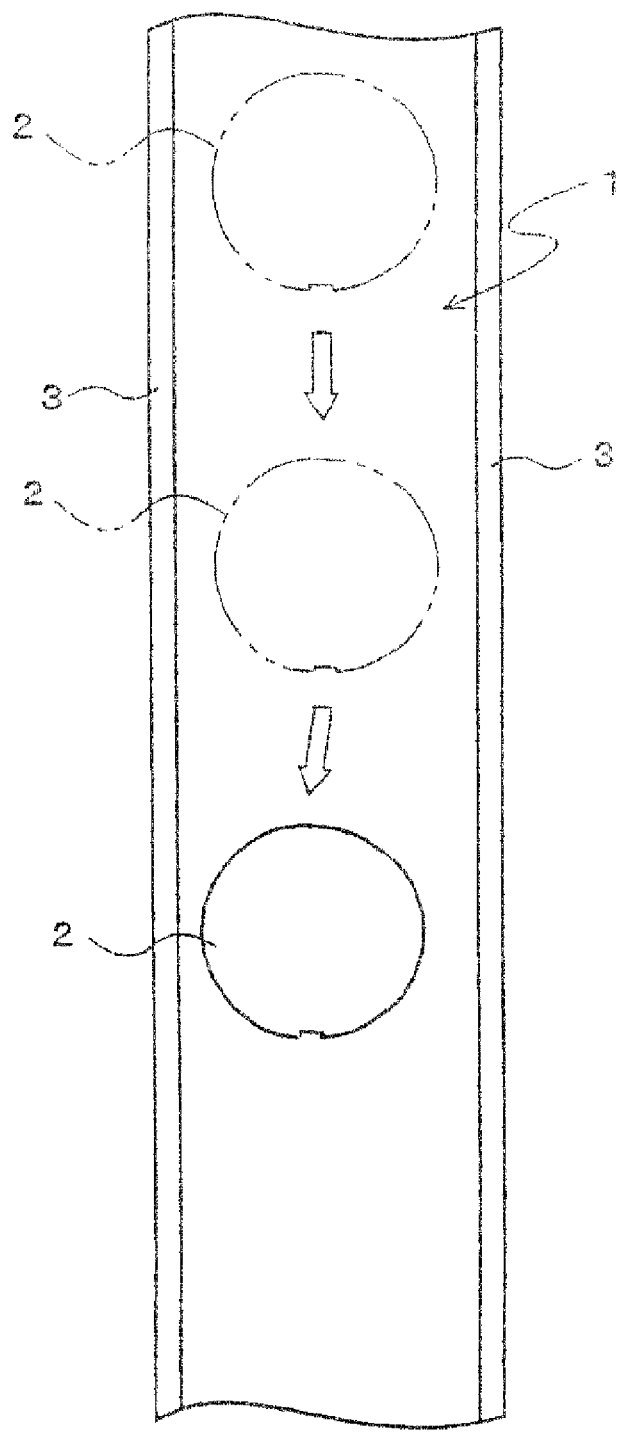
FIG. 6 is a plan view of an essential part of a conventional levitation transportation device.
Figure 7:
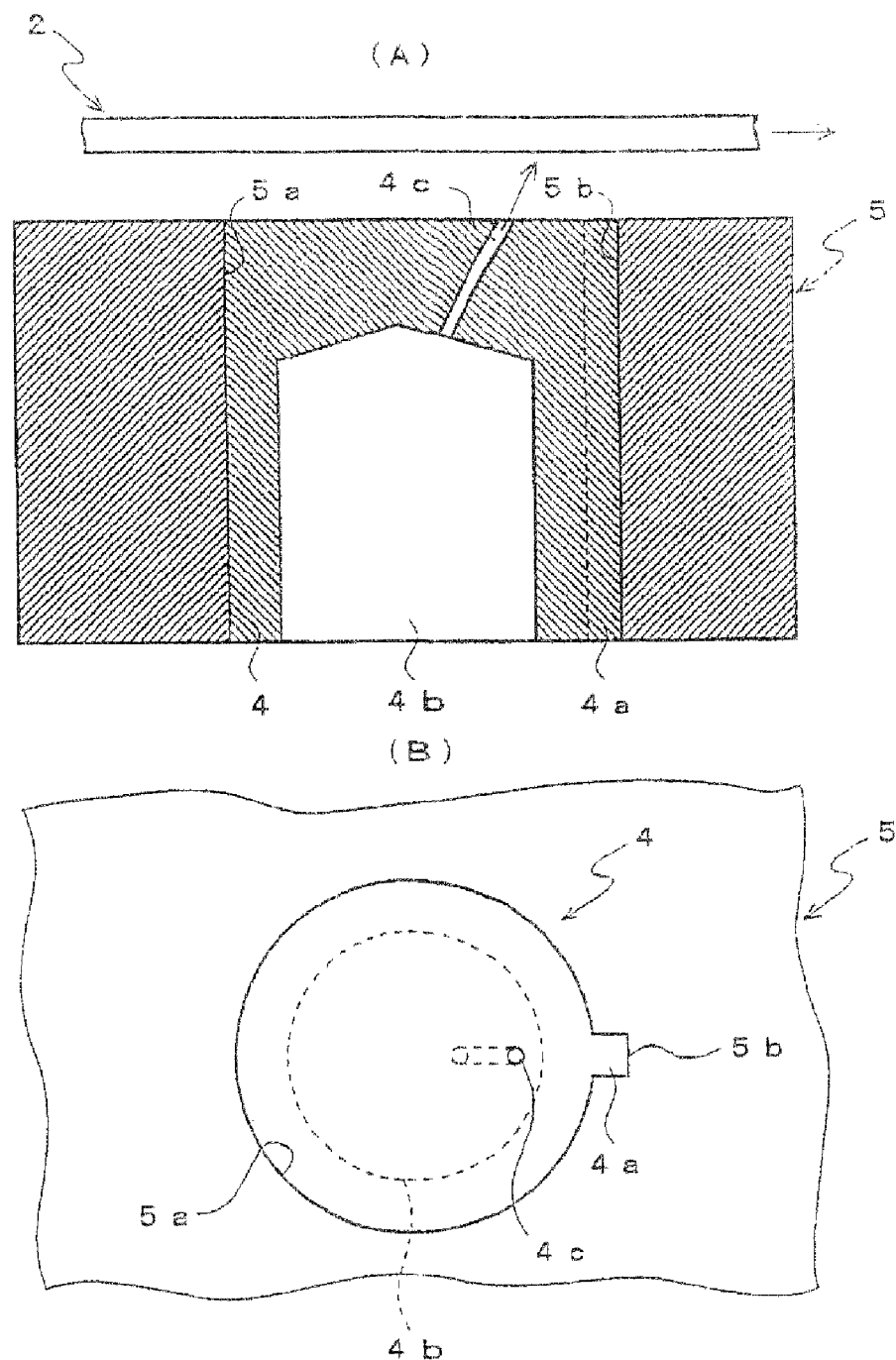
FIG. 7 is a sectional view of a jetting nozzle of the conventional levitation transportation device.

FIG. 1 is a plan view of an essential part of the levitation transportation device of the present invention, FIG. 2 is a sectional view of a jetting nozzle of the levitation transportation device, and FIG. 5 is a perspective view of a nozzle body.

In FIG. 1, a levitation transportation device 10 of the present invention forms a transportation path 11 by arranging a plurality of transfer units and control units laterally and vertically in plural. The transfer units or the control units constitute a predetermined transportation direction by arranging them in plural and adjacent with each other, but arrangement can be made freely, and only a part of straight-state arrangement is shown here.

The levitation transportation device 10 has a guide 13 provided at both edge portions along the transportation path 11, for preventing falling of a semiconductor wafer 12 as an object being transported from the transportation path. Also, the levitation transportation device 10 is provided with, as shown in FIG. 2, a large number of jetting nozzles 15 arranged laterally and vertically on the back face of a holding plate 14 forming the transportation path 11 and a plurality of line sensors 16 crossing the transportation direction of the transportation path 11 and across the entire width of the transportation path 11.

The jetting nozzle 15 has a pressure gas supplied from a pressure-gas supply source such as a compressor through a piping, and a conventional construction is employed as the supply structure. Also, the jetting nozzle 15 is provided with, as shown in FIG. 2, a bracket 17 fixed to the holding plate 14 (or substrate vertically opposed to the holding plate 14) through a frame or the like, not shown, a nozzle body 18 rotatably held by this bracket 17, and a driving motor unit 19 for rotating the nozzle body 18.

The line sensors 16 are placed at appropriate plural locations of the transportation path 11, and its detection result is outputted to a control section 22. At this time, one line sensor 16 monitors one transportation position of the semiconductor wafer 12. For example, a notch 12a is formed at the semiconductor wafer 12 for positioning with a machine at various machining.

Figure 3:
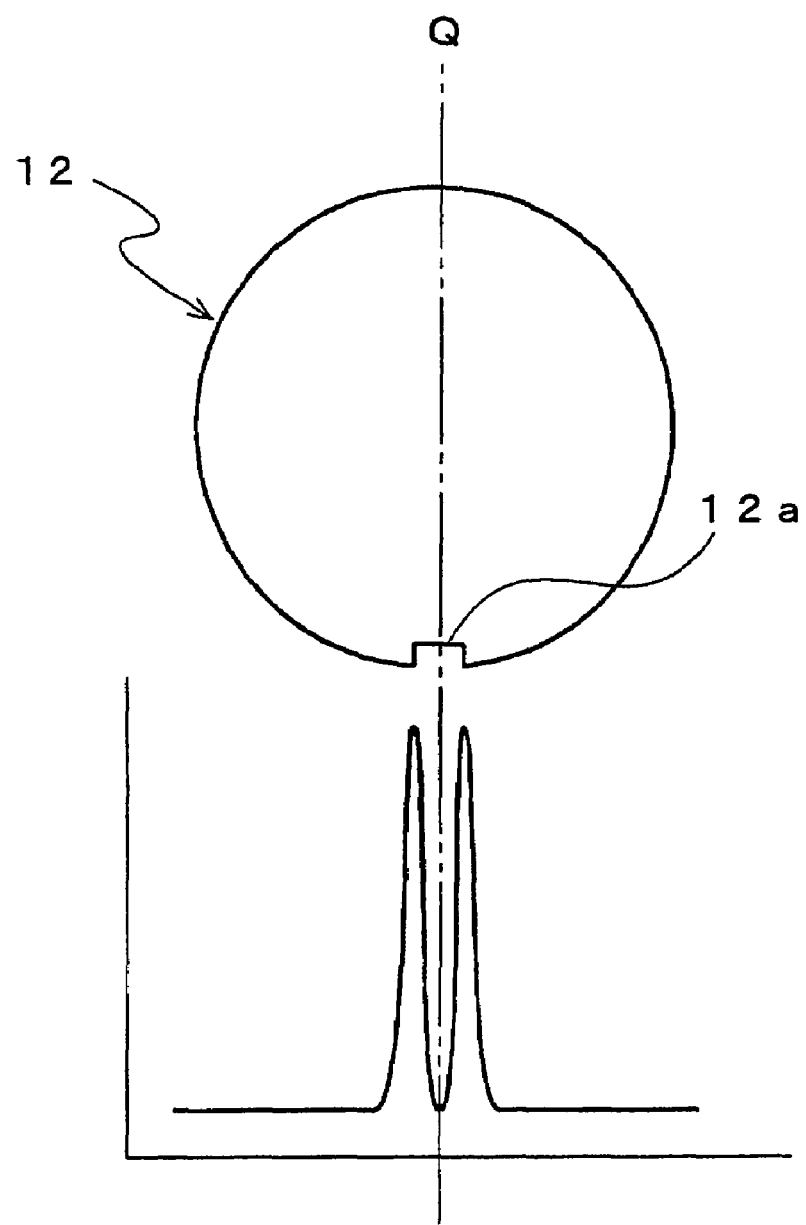
FIG. 3 is a detection graph showing a proper transportation state by a line sensor of the levitation transportation device of the present invention.

Therefore, as shown in FIG. 3, the position of this notch 12a is detected by two interpeak positions, and if the two peaks are located at an equal distance from the center of the line sensor 16, the control section 22 determines that the semiconductor wafer 12 is properly located at a transportation center Q of the transportation path 11 while being transported.

Figure 4:
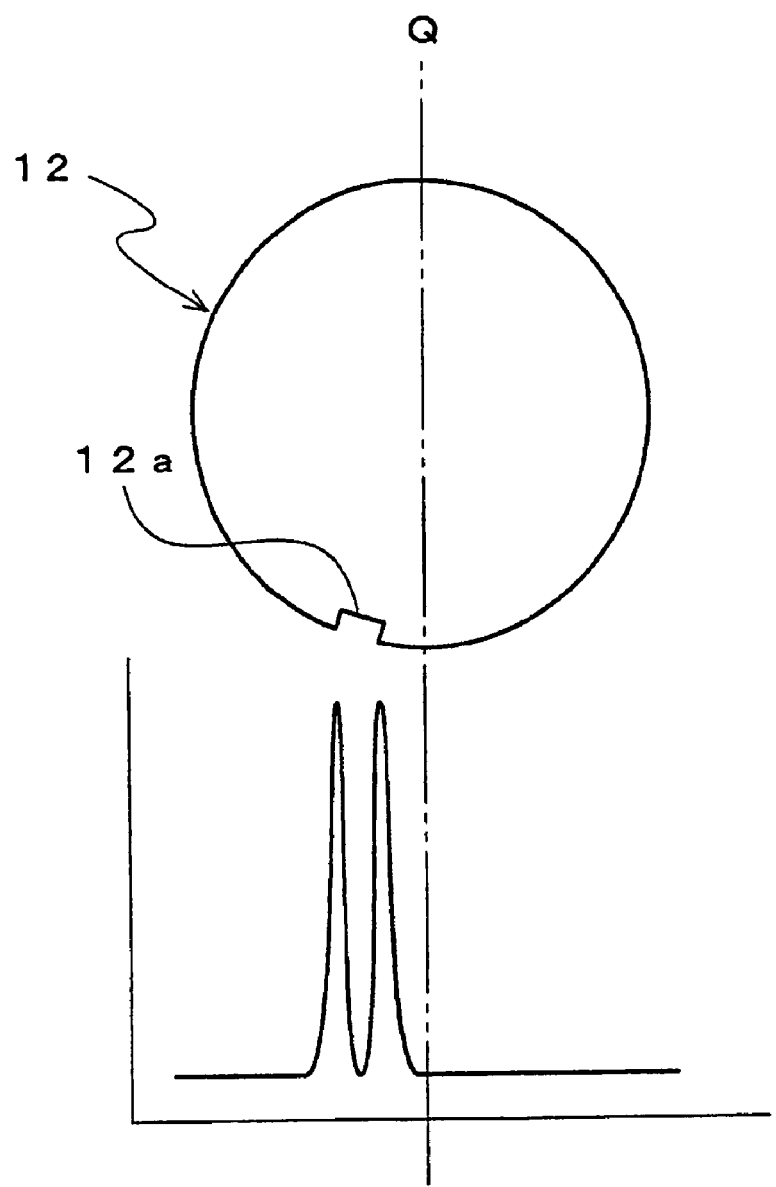
FIG. 4 is a detection graph showing an improper transportation state by a line sensor of the levitation transportation device of the present invention.

On the contrary, as shown in FIG. 4, when the two peaks are displaced from the center of the line sensor 16, the control section 22 determines that the semiconductor wafer 12 is displaced from the transportation center Q of the transportation path 11 while being transported.

The bracket 17 is provided with a communication path 17a communicating with the piping connected form the pressure-gas supply source, not shown, and a holding hole 17b for holding the nozzle body 18. Also, a large-diameter portion 17c opened on the upper face is formed at the upper end of this holding hole 17b. The communication path 17a communicates with the holding hole 17b, but a control valve such as an electromagnetic valve (three-way valve, for example) may be interposed between the above-mentioned piping and the communication path 17a.

The nozzle body 18 is, as shown in FIG. 5, integrally provided with an annular recess portion 18b whose entire outer circumference is recessed in the annular state, forming an annular supply path 18a in cooperation with an inner wall of the holding hole 17b, a communication hole 18c penetrating between the inner wall faces of the annular recess portion 18b via the axis, a shaft hole 18d formed on the axis of the nozzle body 18 and communicating with the communication hole 18c, a nozzle 18e communicating with the upper end of the shaft hole 18d and opened on the upper end face of the nozzle body 18, and an annular flange portion 18f engaged with the large-diameter portion 17c. The nozzle 18e is formed in the perpendicular or inclined state with respect to the nozzle body 18 as necessary (according to the installation place of the transportation path 11). Also, the nozzle body 18 is formed by casting or injection molding or the like and then, the communication hole 18b is formed so as to penetrate between the inner wall faces of the annular recess portion 18b, while the shaft hole 18d is formed on the axis from the lower end face of the nozzle body 18, and then, the nozzle 18e is drilled. By this, the lower part from the communication hole 18b of the shaft hole 18d is sealed by a packing 20.

The driving motor unit 19 rotation-controls the nozzle body 18 in order to adjust the orientation of the nozzle 18e when the nozzle body 18 is mounted at the bracket 17. The driving motor unit 19 also rotation-controls the position of the nozzle body 18 according to a determination result of the control section 22 based on a detection signal from the line sensor 16.

In the above construction, when the control valve such as a compressor is driven, the pressure gas is jetted from the nozzle 18e through the communication path 17a, the supply path 18a (annular recess portion 18b), the communication hole 18c and the shaft hole 18d in this order.

At this time, since the nozzle body 18 is capable of rotation on the horizontal plane by the driving motor unit 19, the jetting direction of the pressure gas jetted from the nozzle 18e can be adjusted.

Also, when the semiconductor wafer 12 is displaced from the transportation path 11 while being transported, the displacement position and the displacement amount are detected by the line sensor 16, and based on the detection result, the control section 22 controls the driving motor unit 19 and rotates the nozzle body 18 to change the jetting direction from the nozzle 18e so as to return the semiconductor wafer 12 to a proper position.

When the semiconductor wafer 12 is being transported, two types of transportation displacement can be considered.

That is, one of the causes of the transportation displacement might be that depending on the processing process of the semiconductor wafer 12, there might be irregularity such as sags by the unit of micrometer formed on the back face on the transportation side of the semiconductor wafer 12, that is, on the surface to which the pressure gas jetted from the nozzle 18e is jetted, and the transportation position of the semiconductor wafer 12 is displaced by this irregularity.

And this type of displacement is given transportation position modification per semiconductor wafer 12 based on the above-mentioned detection result of the displacement position and the displacement amount by the line sensor 16.

On the other hand, if the installation position of the nozzle body 18, that is, the jetting direction of the nozzle 18e is not appropriate, the displacement in the transportation direction of the semiconductor wafer 12 might also occur.

The displacement in this case is considered to occur by the same amount in the same direction continuously, and if this type of displacement occurs, the position of the nozzle body 12 is modified so that the semiconductor wafer 12 is transported appropriately based on the above-mentioned detection result of the displacement position and the displacement amount by the line sensor 16.

INDUSTRIAL APPLICABILITY

According to the levitation transportation device of the present invention, adjustment can be made when an object being transported is displaced from the center of a transportation path.

The invention claimed is:

1. A levitation transportation device, comprising:
   a transportation path forming a transportation route for an object to be transported;
   a plurality of jetting nozzles for transporting the object in a levitated manner along the transportation path;
   at least one detection section configured to detect a direction of the transportation of the object being transported in the transportation path; and
   a control section for independently controlling the plurality of jetting nozzles based on a detection result of the detection section,
   wherein the control section controls a jetting direction of a pressure gas jetted from the jetting nozzle based on the detection result of the detection section.

2. The levitation transportation device according to claim 1, further comprising:
   a line sensor having a detection range crossing the transporting direction of the transportation path and across the entire width of the transportation path.

3. The levitation transportation device according to claim 1, wherein the control section drive-controls a driving motor to rotate the jetting nozzle in a plane based on the detection result of the detection section.

4. The levitation transportation device according to claim 3, wherein the control section controls a jetting direction of the pressure gas jetted from the jetting nozzle so that the object being transported is returned to the center of the transportation path based on the detection result of the detection section.

5. The levitation transportation device according to claim 3, wherein the control section controls a jetting pressure of the pressure gas jetted from the jetting nozzle so that the object being transported is returned to the center of the transportation path based on the detection result of the detection section.

6. The levitation transportation device according to claim 1, wherein the control section controls a jetting direction of the pressure gas jetted from the jetting nozzle so that the object being transported is returned to the center of the transportation path based on the detection result of the detection section.

7. The levitation transportation device according to claim 1, wherein the control section controls a jetting direction of the pressure gas jetted from the jetting nozzle so that the object being transported is not displaced from the center of the transportation path based on the detection result of the detection section.

8. A levitation transportation device, comprising:
   a transportation path forming a transportation route for an object to be transported;
   a plurality of jetting nozzles for transporting the object in a levitated manner along the transportation path;
   at least one detection section configured to detect a direction of the transportation of the object being transported in the transportation path; and
   a control section for independently controlling the plurality of jetting nozzles based on a detection result of the detection section,
   wherein the control section drive-controls a driving motor to rotate the jetting nozzle in a plane based on the detection result of the detection section.

9. The levitation transportation device according to claim 8, wherein the control section controls a jetting direction of the pressure gas jetted from the jetting nozzle so that the object being transported is returned to the center of the transportation path based on the detection result of the detection section.

10. The levitation transportation device according to claim 8, wherein the control section controls a jetting direction of the pressure gas jetted from the jetting nozzle so that the object being transported is not displaced from the center of the transportation path based on the detection result of the detection section.

11. The levitation transportation device according to claim 8, wherein the control section controls a jetting pressure of the pressure gas jetted from the jetting nozzle so that the object being transported is returned to the center of the transportation path based on the detection result of the detection section.

12. The levitation transportation device according to claim 8, wherein the control section controls a jetting pressure of the pressure gas jetted from the jetting nozzle so that the object being transported is not displaced from the center of the transportation path based on the detection result of the detection section.

13. The levitation transportation device according to claim 8, further comprising:
   a line sensor having a detection range crossing the transporting direction of the transportation path and across the entire width of the transportation path.

14. A levitation transportation device, comprising:
   a transportation path forming a transportation route for an object to be transported;
   a plurality of jetting nozzles for transporting the object in a levitated manner along the transportation path;
   at least one detection section configured to detect a direction of the transportation of the object being transported in the transportation path; and a control section for independently controlling the plurality of jetting nozzles based on a detection result of the detection section, wherein the control section controls a jetting direction of the pressure gas jetted from the jetting nozzle so that the object being transported is returned to the center of the transportation path based on the detection result of the detection section.

15. The levitation transportation device according to claim 14, wherein the control section controls a jetting direction of the pressure gas jetted from the jetting nozzle so that the object being transported is not displaced from the center of the transportation path based on the detection result of the detection section.

16. The levitation transportation device according to claim 14, further comprising:
a line sensor having a detection range crossing the transporting direction of the transportation path and across the entire width of the transportation path.

17. A levitation transportation device, comprising:
a transportation path forming a transportation route for an object to be transported;
a plurality of jetting nozzles for transporting the object in a levitated manner along the transportation path;
at least one detection section configured to detect a direction of the transportation of the object being transported in the transportation path; and
a control section for independently controlling the plurality of jetting nozzles based on a detection result of the detection section, wherein the control section controls a jetting direction of the pressure gas jetted from the jetting nozzle so that the object being transported is not displaced from the center of the transportation path based on the detection result of the detection section.

18. The levitation transportation device according to claim 17, wherein the control section controls a jetting direction of the pressure gas jetted from the jetting nozzle when a detection result that the object being transported is displaced from the center of the transportation path continuously in the same direction is obtained from the detection section.

19. The levitation transportation device according to claim 17, further comprising:
a line sensor having a detection range crossing the transporting direction of the transportation path and across the entire width of the transportation path.

* * * * *